United States Patent
Lee et al.

(10) Patent No.: US 6,805,293 B2
(45) Date of Patent: Oct. 19, 2004

(54) DATA COLLECTION SYSTEM

(75) Inventors: Vic Lee, Hsinchu (TW); Kevin Duan, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 48 days.

(21) Appl. No.: 10/234,890

(22) Filed: Sep. 4, 2002

(65) Prior Publication Data

US 2003/0121977 A1 Jul. 3, 2003

(30) Foreign Application Priority Data

Jan. 3, 2002 (TW) ........................................ 91100043 A

(51) Int. Cl.$^7$ ................................................. G06K 7/14
(52) U.S. Cl. .................... 235/454; 235/453; 235/444
(58) Field of Search ................................. 235/375, 454, 235/453, 444; 439/491, 489

(56) References Cited

U.S. PATENT DOCUMENTS

| | | | | |
|---|---|---|---|---|
| 3,651,315 A | * | 3/1972 | Collins ........................ | 235/375 |
| 4,484,329 A | * | 11/1984 | Slamka et al. ................. | 371/25 |
| 5,334,044 A | * | 8/1994 | Falossi et al. ................ | 439/491 |
| 5,581,491 A | * | 12/1996 | Biwer et al. .................. | 364/580 |
| 5,808,760 A | * | 9/1998 | Gfeller ........................ | 359/110 |
| 6,457,071 B1 | * | 9/2002 | Thorland et al. .............. | 710/19 |
| 6,496,884 B1 | * | 12/2002 | Friesen ........................ | 710/100 |
| 6,612,495 B2 | * | 9/2003 | Reddersen et al. ..... | 235/462.15 |

* cited by examiner

Primary Examiner—Michael G. Lee
Assistant Examiner—Ahshik Kim
(74) Attorney, Agent, or Firm—Volpe and Koenig, P.C.

(57) ABSTRACT

A data collection system for collecting data of an electronic device is provided. The data collection system includes: a processor for detecting and classifying the electronic device, a test device driven by the processor for testing the electronic device, a light coupling set, and a data collector respectively connected with the processor and the test device optically through the light coupling set for optically collecting the data of the electronic device from the processor and the test device and transforming the data into a particular information format. The feature of the data collection system is that, the protocol used for different outside devices is burned in the microprocessor in a format of firmware program so that the need for altering the hardware circuit is prevented.

7 Claims, 4 Drawing Sheets

DATA COLLECTION SYSTEM

FIELD OF THE INVENTION

The present invention is related to an electronic data collector (EDC), and more particularly, to an electronic data collection system and an electronic data collector which is able to be co-operated with all kinds of test devices.

BACKGROUND OF THE INVENTION

Please refer to FIG. 1. FIG. 1 is a diagram illustrating the traditional electronic data collection system 10 according to the prior art. The processor (detector) 101 is used for detecting and classifying the electronic device, for example, a die. The processor 101 also transmits a start signal to drive the test device 102 for testing the IC standard. The IC information obtained from the test device 102 is presented by a binary system. Meanwhile, the test device 102 will transmit an end-of-test (EOT) signal to the processor 101 after the testing is finished. The binary data obtained from the processor 101 or the test device 102 is transmitted to an electronic data collector 104 through a TTL cable 103. The electronic data collector 104 then arranges the collected binary data and transfers it into a particular information format. Through a 8255 I/O interface 105, the particular information format is then transmitted to a data collection host machine 106, for example, a personal computer. The IC testing worker can understand the type and the standard of the tested IC through the information displayed in the data collection host machine 106. Alternatively, the information of the tested IC can be read through the internet by the authorized worker when the data collection host machine 106 is connected with the internet and saves the data in a data bank through the internet.

However, in the traditional electronic data collection system 10, the respectively independent systems are connected to each other by electric cable, in addition to the system power. When the signal is transmitted, the interference will be produced, consequently, the data collection host machine 106 will receive the information erroneously.

Moreover, there is only one protocol between the traditional electronic data collector 104 and the outside devices. Also, the fixed circuit is used for coding/decoding and mimicking the information judgment. Once it needs to be co-operated with different devices, the transformed circuit needs to be plugged-in for the mutual communication between the electronic data collector 104 and the outside devices. Therefore, it is necessary to alter the hardware circuit design of the electronic data collector 104 when it is co-operated with different devices, which is very inconvenient for the product designers.

Additionally, in the traditional electronic data collection system 10, the misconnection-proof device (not shown) is usually fixedly mounted on the connected cable between the IC and the test device 102 for designating the connection relationship between the IC and the particular test device. If there is something wrong, the electronic data collector 104 cannot identify which IC is tested by which test device but only receiving the transmitted warning. Thus, the cooperation between the test device 102 and the cables is largely reduced.

In order to overcome the drawbacks in the prior art, a data collection system for collecting data of an electronic device is provided, which is able to be co-operated with all kinds of test devices.

SUMMARY OF THE INVENTION

The main purpose of the present invention is to provide a data collection system for collecting data of an electronic device, which is able to be co-operated with all kinds of test devices.

It is one object of the present invention to provide a data collection system for collecting data of an electronic device, wherein the controlling/information signal between the test device and the processor is transmitted through the light coupling device as the optical signal.

It is another object of the present invention to provide a data collection system for collecting data of an electronic device, wherein the compatibility between the electronic data collector and the test device is increased.

It is another object of the present invention to provide a data collection system for collecting data of an electronic device, wherein the protocol used for different outside devices is burned in the microprocessor in a format of firmware program so that the need for altering the hardware circuit is prevented.

According to one aspect of the present invention, a data collection system for collecting data of an electronic device, comprises: a processor for detecting and classifying the electronic device, a test device driven by the processor for testing the electronic device, a light coupling set, and a data collector respectively connected with the processor and the test device optically through the light coupling set for optically collecting the data of the electronic device from the processor and the test device and transforming the data into a particular information format.

In accordance with the present invention, the data collection system further comprises a data collection host machine for receiving the particular information format of the data of the electronic device from the data collector through an electrical cable and saving the particular information format of the data of the electronic device.

Preferably, the data of the electronic device is presented by a binary system.

Preferably, the electrical cable is a 8255 I/O interface cable.

Preferably, the light coupling set comprises a first light coupling device for connecting the test device and the data collector and a second light coupling device for connecting the data collector and the processor.

According to another aspect of the present invention, a data collection system for collecting data of at least one electronic device, comprises: a processor for detecting and classifying the electronic device, at least one test device having a serial number thereon and connected with the electronic device through a cable for testing the electronic device, and a data collector optically connected with the processor and the test device through a light coupling device respectively for optically collecting the data of the electronic device from the processor and the test device and transforming the data into a particular information format.

In accordance with the present invention, the cable further comprises a misconnection-proof device having a fixed identification code thereon.

Preferably, the misconnection-proof device is a jumper.

Preferably, the data collector further comprises a microprocessor for matching the fixed identification code on the misconnection-proof device and the serial number on the test device connected therewith, thereby allotting the data of the electronic device to the test device having the serial number matched to the fixed identification code when the fixed identification code on the misconnection-proof device does not match the serial number on the test device connected therewith.

Preferably, the data collection system further comprises a data collection host machine for receiving the particular information format of the data of the electronic device from the data collector through an electrical cable and saving the particular information format of the data of the electronic device.

According to another aspect of the present invention, a data collector, comprises: a signal input port for receiving a light signal carrying data of an electronic device from a test device, a microprocessor saving at least one communication program for collecting the data of the electronic device transmitted from the test device, encoding the data into a collected data and decoding a protocol between the electronic data collector and the test device, and a signal output port for outputting the collected data to a data collection host machine.

In accordance with the present invention, the electronic data collector further comprises a switch device for choosing a specific the communication program from the microprocessor to encode and decode the protocol between the electronic data collector and the test device when the protocol is changed.

In order to make the data collector compatible with all kinds of test devices without altering the hardware circuit of the data collector while changing different test device, the protocol-related information is burned in the processor in a format of firmware program in the preferred embodiment in the present invention. That is, the circuit for coding/decoding the protocol-related information between the data collector and the outside devices is replaced with the firmware program, which is burned in the microprocessor of single chip. When different test device is changed, it merely need to change the firmware program without altering the hardware circuit of the data collector.

The foregoing and other features and advantages of the present invention will be more clearly understood through the following descriptions with reference to the drawings, wherein:

DETAILED DESCRIPTION OF THE PREFERRED EMBODIMENT

Figure 1:
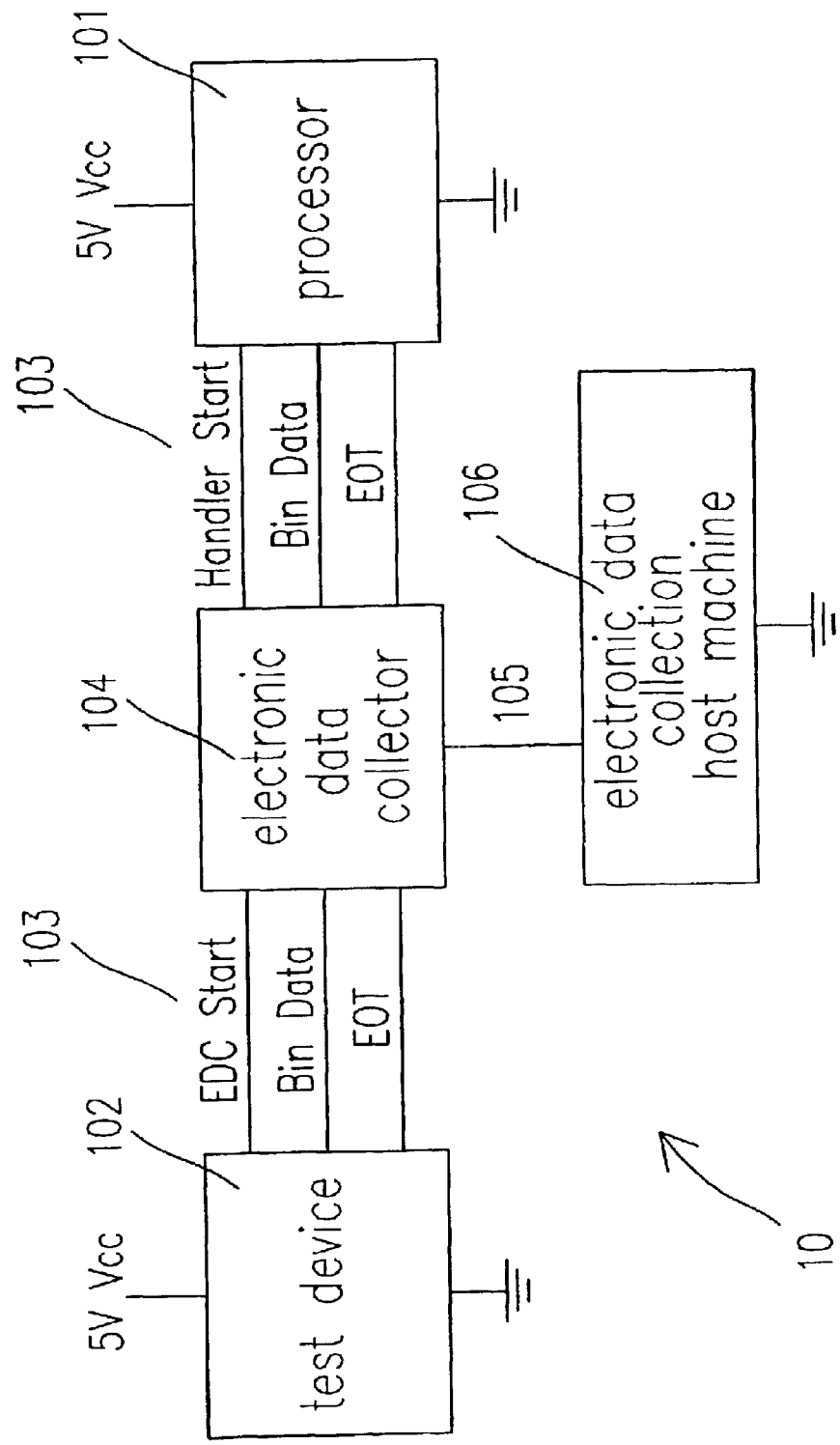
FIG. 1 is a diagram illustrating the traditional electronic data collection system according to the prior art.
Figure 2:
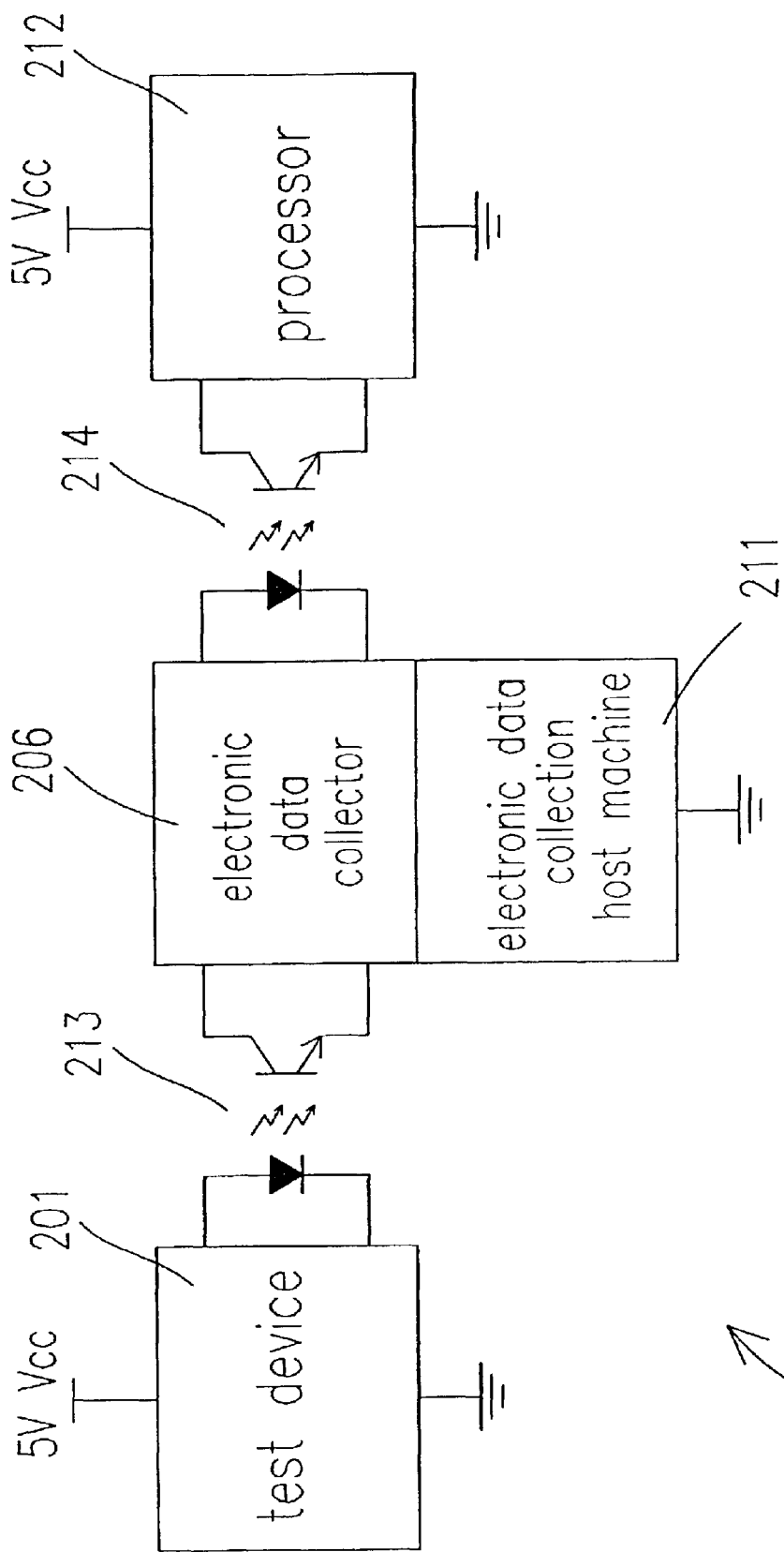
FIG. 2 is a diagram illustrating the electronic data collection system according to a preferred embodiment of the present invention.

The present invention will now described more specifically with reference to the following embodiments. Please refer to FIG. 2. FIG. 2 is a diagram illustrating the electronic data collection system according to a preferred embodiment of the present invention. The test device 201 and the processor 212 are respectively connected with the electronic data collector 206 through the light coupling device 213 and light coupling device 214. The controlling signal between the test device 201 and the processor 212 and the binary information signal transmitted to the electronic data collector 206 are respectively transmitted through the light coupling device 213 and light coupling device 214 as optical signals. In such way, the drawback in the prior art, that the interference is produced when the electronic signal is transmitted through electric cable, is able to be overcome thoroughly. In addition, the system stability and the accuracy of information judgment will be increased.

Figure 3:
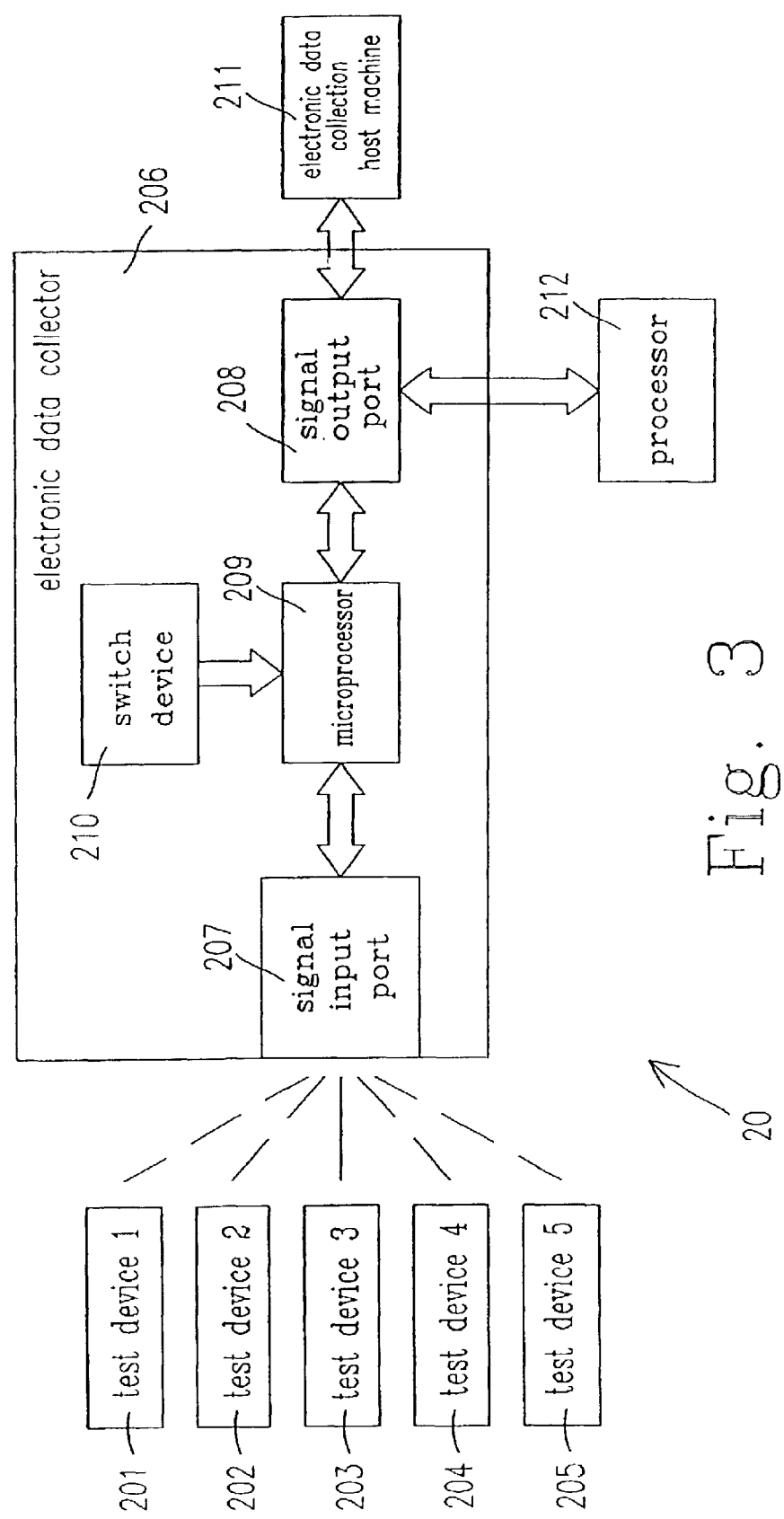
FIG. 3 is a diagram illustrating the co-operation between the electronic data collector and all kinds of different test devices according to a preferred embodiment of the present invention.

Please refer to FIG. 3. FIG. 3 is a diagram illustrating the co-operation between the electronic data collector and all kinds of different test devices according to a preferred embodiment of the present invention. In order to cooperate the electronic data collector 206 to different kinds of test devices, 201–205, a microprocessor of single chip 209 is used to replace the fixed circuit which is previously used for coding/decoding and mimicking the information judgment in the prior art. The protocol used for different outside devices is burned in the microprocessor 209 in a format of firmware program. The electronic data collector 206 further includes a signal input port 207 and a signal output port 208. The signal input port 207 receives the light signal with the binary information from the test devices 201–206 and transmits the signal to the electronic data collection host machine 211. The signal output port 208 receives the light signal with the binary information from the processor (detector) 212 and transmits the signal to the electronic data collection host machine 211. The inside firmware program in the microprocessor is used for transmitting the signal and handling the coding and decoding of the hardware. Moreover, the electronic data collector 206 includes a switch device 210 provided for the user to switch the microprocessor 209 to a proper protocol when a test device is altered. Therefore, if the electronic data collector 206 is cooperated with different test devices, all it needs to do is to modify the firmware program and burn it into the microprocessor 209. In other words, the hardware circuit of the electronic data collector 206 is unnecessary to be altered. Therefore, the protocol and the signal format used in the microprocessor are able to be chosen and switched according to the types of the test devices cooperated with. Since the hardware transforming circuit is not needed to be plugged-in, the compatibility between the electronic data collector 206 and the test device is largely increased and the cost for setting up will be lower.

Figure 4:
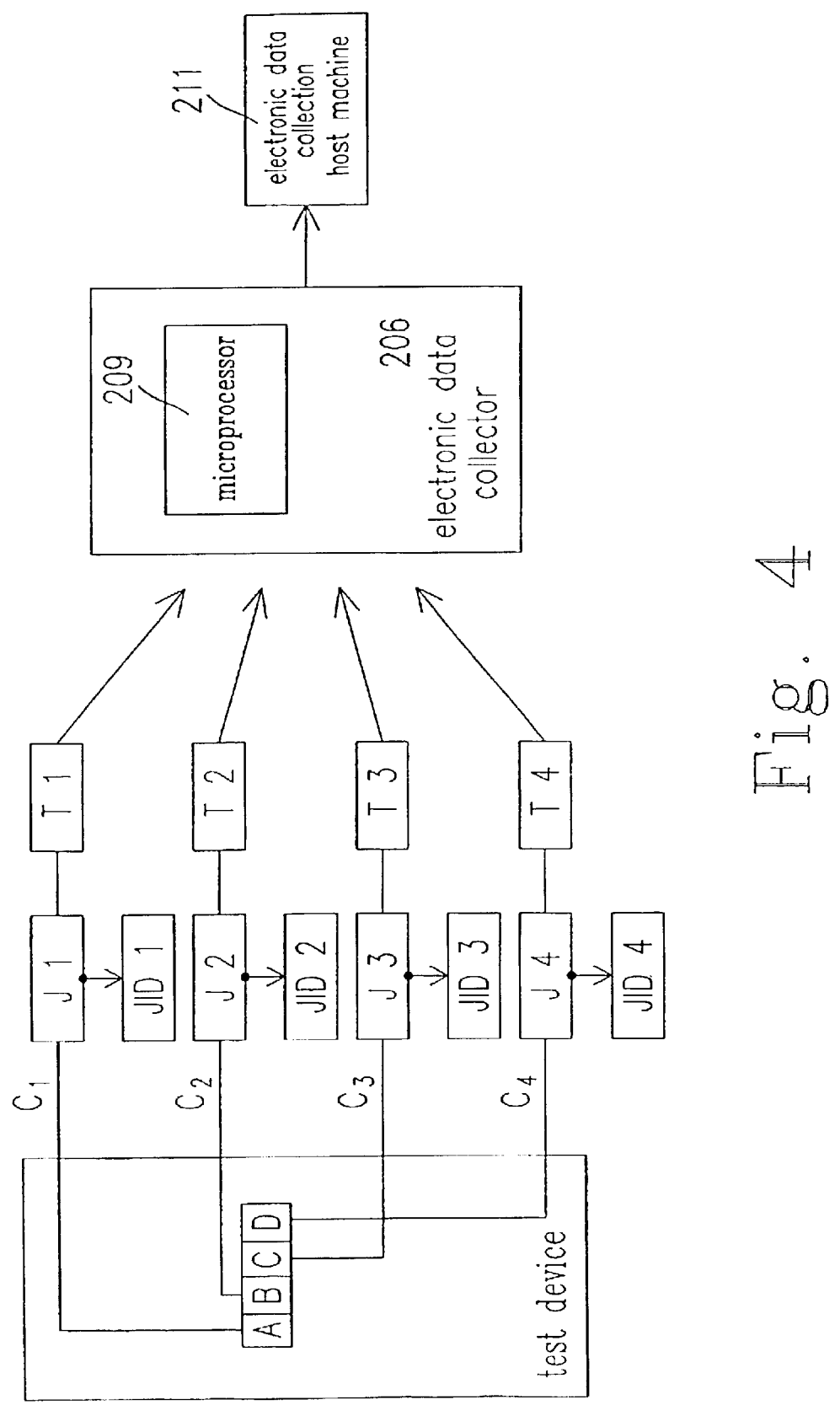
FIG. 4 is a diagram illustrating the connection relationship among the misconnection-proof device, the test device, and the electronic data collector according to a preferred embodiment of the present invention.

Please refer to FIG. 4. FIG. 4 is a diagram illustrating the connection relationship among the misconnection-proof device, the test device, and the electronic data collector according to a preferred embodiment of the present invention. In order to prevent the cable of the tested chip form connecting to a mistaken device, which might cause the mistaken judgment of the collected information, a misconnection-proof device is used in the present invention. The flexible misconnection-proof device (it is a jumper in this embodiment.) is mounted on the cable of the tested chip. Every jumper has a fixed and particular jumper ID for identifying every cable. When the chip cable is connected with the test device and the test device is coupling the light to the electronic data collector, the microprocessor of the electronic data collector will check whether every cable is connected with its corresponded test device correctly by identifying the jumper ID. As shown in FIG. 4, the four tested chips A, B, C, and D are respectively connected with the test devices T1, T2, T3, and T4 through four chip cables C1, C2, C3, and C4. The four test devices couple the light to the electronic data collector 206 through four light coupling devices (not shown). Each chip cable C1, C2, C3, and C4 has a jumper J1, J2, J3, and J4 mounted thereon and each jumper has a jumper ID (JID1 for J1, JID2 for J2, JID3 for J3, and JID4 for J4). When the chip cable C1 is erroneously connected with the test device T2 and the chip cable C2 is erroneously connected with the test device T1, the microprocessor will compare the jumper ID (JID1, JID2, JID3, and JID4) on the chip cable with the serial number (T1, T2, T3, and T4) of the test device to see whether they are matched. In such way, whether the chip cable is connected with the corresponded test device is easily judged by the jumper ID. After compared, if the chip cable C1 is found erroneously connected with the test devices T2 instead of its corresponded test device T1 and the chip cable C2 is found erroneously connected with the test devices T1 instead of its corresponded test device T2, the microprocessor will automatically adjust itself That is, the processor will set the binary information transmitted from the test device T1 as the tested information of the chip B, and set the binary information transmitted from the test device T2 as the tested information of the chip A. Therefore, even though the cable plug is not correctly connected to the outlet of the corresponded test device, the microprocessor 209 of the electronic data collector 206 is able to make the right judgment. As long as the jumper location is not changed, which means the jumper ID is not altered, the microprocessor 209 is able to judge the binary information transmitted through the particular cable is from which test device and belongs to which chip. Afterwards, the microprocessor 209 will transmit the correct information to the electronic data collection host machine 211. When the chip cable is matched to the mistaken test device, which results in the incorrect order of the collected information, the microprocessor is able to find out which chip the binary information belongs to. The microprocessor will also restore the incorrect information order to the correct information order so that the error of judgment mistake caused by the disorder between the collected information and the tested chip can be prevented.

From the above description, it is known that the present invention uses the light coupling device to transmit the controlling/information signal among the test device, the processor, and the electronic data collector in an optical method so that the interference caused by transmitting method of electric cable can be prevented and the independent power of individual device can be separated. Additionally, the hardware coding/decoding circuit cooperated with the protocol is set up in the microprocessor of the electronic data collector in the format of firmware program. Not only the compatibility between the electronic data collector and the test device is increased, but also the need for altering the hardware circuit is prevented. Furthermore, the flexible misconnection-proof device is mounted between the ship cable and the test device. The microprocessor of the electronic data collector is able to judge whether the chip cable is connected with the corresponded test device in order to prevent the collected information from being erroneously judged.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A data collection system for collecting data of at least one electronic device, comprising:

a processor for detecting and classifying said electronic device;

at least one test device having a serial number thereon and connected with said electronic device through a cable for testing said electronic device, wherein said cable further comprises a misconnection-proof device having a fixed identification code thereon; and a data collector optically connected with said processor and said test device through a light coupling device respectively for optically collecting said data of said electronic device from said processor and said test device and transforming said data into a particular information format, wherein whether said serial number on said test device is matched with said fixed identification code of said misconnection-proof device connected therewith is judged by said data collector.

2. The data collection system according to claim 1, wherein said misconnection-proof device is a jumper.

3. The data collection system according to claim 1, wherein said data collector further comprises a microprocessor for matching said fixed identification code on said misconnection-proof device and said serial number on said test device connected therewith, thereby allotting said data of said electronic device to said test device having said serial number matched to said fixed identification code when said fixed identification code on said misconnection-proof device does not match said serial number on said test device connected therewith.

4. The data collection system according to claim 1, wherein said data collection system further comprises a data collection host machine for receiving said particular information format of said data of said electronic device from said data collector through an electrical cable and saving said particular information format of said data of said electronic device.

5. The data collection system according to claim 4, wherein said electrical cable is a 8255 I/O interface cable.

6. The data collection system according to claim 1, wherein said data of said at least one electronic device is presented by a binary system.

7. A data collector, comprising:

a signal input port for receiving a light signal carrying data of an electronic device from a test device;

a microprocessor saving at least one communication program for collecting said data of said electronic device transmitted from said test device, encoding said data into a collected data and decoding a protocol between said electronic data collector and said test device;

a signal output port for outputting said collected data to a data collection host machine; and a switch device for choosing a specific said communication program from said microprocessor to encode and decode said protocol between said electronic data collector and said test device when said protocol is chanted.

* * * * *